United States Patent
Vogt et al.

(10) Patent No.: US 8,581,357 B2
(45) Date of Patent: Nov. 12, 2013

(54) PACKAGE COMPRISING AN ELECTRICAL CIRCUIT

(75) Inventors: Holger Vogt, Muelheim (DE); Jochen Bauer, Juelich (DE)

(73) Assignee: Fraunhofer-Gesellschft zur Foerderung der Angewandten Forschung e.V., Munich (DE)

( * ) Notice: Subject to any disclaimer, the term of this patent is extended or adjusted under 35 U.S.C. 154(b) by 223 days.

(21) Appl. No.: 12/298,320

(22) PCT Filed: Apr. 24, 2007

(86) PCT No.: PCT/EP2007/003607
§ 371 (c)(1),
(2), (4) Date: Nov. 10, 2008

(87) PCT Pub. No.: WO2007/121992
PCT Pub. Date: Nov. 1, 2007

(65) Prior Publication Data
US 2009/0102003 A1 Apr. 23, 2009

(30) Foreign Application Priority Data
Apr. 25, 2006 (DE) .......................... 10 2006 019 080

(51) Int. Cl.
*H01L 31/0203* (2006.01)
(52) U.S. Cl.
USPC .................. 257/433; 257/E29.324; 438/50
(58) Field of Classification Search
USPC ............... 438/50, 64, 52, E21.613; 257/433, 257/E21.499, E31.11
See application file for complete search history.

(56) References Cited

U.S. PATENT DOCUMENTS

| 3,678,570 A | 7/1972 | Paulonis et al. |
| 4,907,065 A | 3/1990 | Sahakian |
| 5,895,233 A | 4/1999 | Higashi et al. |
| 6,062,461 A | 5/2000 | Sparks et al. |
| 6,479,320 B1 | 11/2002 | Gooch |
| 6,512,219 B1 | 1/2003 | Webster et al. |

(Continued)

FOREIGN PATENT DOCUMENTS

| DE | 43 03 790 A1 | 8/1994 |
| DE | 103 03 588 B3 | 8/2004 |

(Continued)

OTHER PUBLICATIONS

Official communication issued in counterpart International Application No. PCT/EP2007/003607, mailed on Aug. 29, 2007.

(Continued)

*Primary Examiner* — Tony Tran
(74) *Attorney, Agent, or Firm* — Keating & Bennett, LLP

(57) ABSTRACT

A package including an electrical circuit may be produced in a more efficient manner when on a substrate including a plurality of electrical circuits the circuits are tested for their functionality and when the functional circuits are connected, by means of a frame enclosing the circuit on the surface of the substrate, to a second substrate whose surface area is smaller than that of the first substrate. The substrates are connected, by means of a second frame, which is adapted to the first frame and is located on the surface of the second substrate, such that the first and second frames lie one on top of the other. Subsequently, the functional packaged circuits may be singulated in a technologically simple manner.

18 Claims, 5 Drawing Sheets

(56) References Cited

U.S. PATENT DOCUMENTS

| | | | |
|---|---|---|---|
| 6,521,477 | B1 | 2/2003 | Gooch et al. |
| 6,793,829 | B2 | 9/2004 | Platt et al. |
| 6,812,638 | B2 | 11/2004 | Wakimoto et al. |
| 7,838,322 | B1 * | 11/2010 | Vargo et al. .................... 438/53 |
| 7,936,062 | B2 * | 5/2011 | Humpston et al. ............. 257/704 |
| 2002/0000649 | A1 * | 1/2002 | Tilmans et al. ................ 257/704 |
| 2002/0113296 | A1 | 8/2002 | Cho et al. |
| 2003/0104651 | A1 | 6/2003 | Kim et al. |
| 2003/0160021 | A1 | 8/2003 | Platt et al. |
| 2004/0266048 | A1 * | 12/2004 | Platt et al. ...................... 438/50 |
| 2008/0272306 | A1 * | 11/2008 | Greywall ................... 250/385.1 |

FOREIGN PATENT DOCUMENTS

| | | | |
|---|---|---|---|
| EP | 1 405 821 | A2 | 4/2004 |
| WO | 01/36320 | A2 | 5/2001 |
| WO | 2005/108283 | A1 | 11/2005 |
| WO | WO2005108283 | * | 11/2005 |

OTHER PUBLICATIONS

Scheiring et al.: "Advanced-Chip-To-Wafer Technology: Enabling Technology for Volume Production of 3D System Integration on Wafer Level," IMAPS 2004; Nov. 14-18, 2004; 11 pages.

Tilmans et al.: "The Indent Reflow Sealing (IRS) Technique—A Method for the Fabrication of Sealed Cavities for MEMS Devices," Journal of Microelectromechanical Systems; vol. 9, No. 2; Jun. 2000; pp. 206-217.

Hübner et al.: "Micro Contacts With Sub-30μm Pitch for 3D Chip-On-Chip Integration," MAM 2006; Mar. 2006; 39 pages.

Wood: "Monolithic Silicon Microbolometer Arrays," Semiconductor and Semimetals; vol. 47; Academic Press; 1997; pp. 115.

Datenblatt UL 02 05; "The Silicon Infrared Detector," www.ulis-ir.com/pdf/ULIS02; Jul. 4, 2008; 2 pages.

* cited by examiner

PACKAGE COMPRISING AN ELECTRICAL CIRCUIT

BACKGROUND OF THE INVENTION

The present invention relates to packages for electrical circuits, and in particular to such packages, and to a method for manufacturing same, which encapsulate an electrical circuit within a self-contained volume.

Applications in which electrical, optical, micromechanical or other devices may be arranged within a package to ensure their functioning are manifold. For example, infrared sensors for infrared cameras, thermal image cameras or image sensors for night-vision devices are arranged within closed packages for avoiding damage or environmental factors distorting the measurements. In the micromechanical field, this is also true for gyroscopes and electrically adjustable micro-mirrors and other mechanical components such as micromechanical sensors. In cameras for visible light or other sensors, both individual sensors, rows of sensors or entire two-dimensional arrays may be arranged within a package in this context.

With some sensors such as bolometers, for example, the requirements placed upon the package are extremely high if same has to enclose the sensor, however without impairing the sensor's functionality in that the quantity to be measured by the sensor is distorted by the package. For a bolometer, which essentially serves to measure temperatures by detecting emitted infrared radiation, packages are particularly complicated to manufacture, as will be briefly explained below.

A bolometer as is shown in FIG. 6, for example, measures the infrared radiation essentially in that the radiation is absorbed within a material which is arranged within the sensor and whose temperature and resistance changes as a result. Such a membrane 2, which consists of a material having a finite electrical resistance, will change this resistance as a function of the increase in temperature and of the temperature coefficient of the resistance. However, this gives rise to the problem that the temperature change in the resistance is very small (several Millikelvin) due to the small amount of incoming energy of the thermal radiation in the infrared range. It is therefore particularly important, in the bolometer shown in FIG. 6, to arrange the membrane 2 such that it is thermally isolated from a carrier substrate 4 so as not to influence the extremely sensitive measurement, for example in that the membrane temperature is artificially modified by being thermally conducted via the connection contacts of the membrane 2. Thus, the success of the measurement highly depends on that the resistor is mounted such that its thermal isolation is good. This is generally achieved in that the membrane 2 is connected to the substrate via connections 6a and 6b comprising thin, long arms, as may be seen in FIG. 6. These arms exhibit a relatively high thermal resistance, since their heat-transferring cross-section is very small.

Since on such an integrated device, the large-area membrane 2 is arranged at a small distance from the substrate 4, the thermal conduction occurring via the gap between the membrane 2 and the substrate 4 may be undermined. Since the most efficient heat transfer occurs by convection, the surroundings of the bolometer and/or of the membrane 2 may be evacuated. Conventionally, this has generally been realized in that the microbolometer chip as such is mounted within a package which may be evacuated. FIGS. 7 and 8 depict an example of such a package which is in line with conventional technology, the exploded view in FIG. 7 in particular showing how much effort is involved in manufacturing such a package. Such packages, which are typically made of metal, are consequently very costly, so that they are not suitable for being used in the mass market. Moreover, due to the fact that the entire chip is fully enclosed by the package, the volume of the package is clearly larger than that of the actual detector chip.

Therefore, in the recent past an enormous amount of effort has been put into developing methods which enable packaging a device as early as at the wafer level.

For example, U.S. Pat. No. 5,895,233 describes how a package may be fabricated which is hardly any larger than the detector chip itself. In this context, microbolometer arrays are manufactured on a substrate, or on a first wafer. Each array has a metal frame manufactured around it, on which soldering tin is deposited. A lid wafer is manufactured which is also provided with a plurality of solderable metal frames. The arrangement of the frames on the second wafer matches, as a mirror image, the frames on the first wafer. In a wafer bonding process, the lid wafer is initially mounted upside down on the substrate wafer, each frame of the lid wafer coming to lie on the corresponding frame of the substrate wafer. Subsequently, both wafers are soldered to each other under protective gas or under vacuum. For singulating, or dicing, the chips, the resulting layer structure is subsequently sawn into pieces and disassembled into the individual detector chips. On the basis of this fundamental idea, there are a series of further developments which are shown, for example, in U.S. Pat. Nos. 6,479,320 B1 and 6,521,477 B1.

These methods have in common that they result in relatively compact detector chips. On account of the approach employed, these methods have several serious disadvantages, however. First of all, the substrate or the wafer and the lid are typically equal in size. As a result, the flexibility of procuring the lid and the substrate from different sources and manufacturing sites is lost. Lids which may consist of specific materials having precisely defined physical properties are typically not available in the large diameters customary for silicon wafers. This is true, in particular, for microbolometric systems wherein the lid at the same time is the input window for the radiation and thus exhibit a high level of transmittance in the infrared spectral range.

In terms of soldering itself, there is the problem that the wafers are initially adjusted, and after adjustment are placed into a vacuum chamber, where they are then pressed onto one another and soldered. In order not to jeopardize the adjustment with this approach, costly transport and vacuum means may be used.

A further major disadvantage is that in a structure which is bonded and soldered in this manner, it is in each case only the two rear sides of the original wafers that are visible. In this manner, any adjusting marks which may have been placed on the wafer surface and which may be used for sawing up the wafer for singulating using a wafer saw are thus no longer visible without taking additional costly measures. Even if the sawing paths between the detector chips are known, the sawing process itself is highly complicated, since the lid wafer is typically sawn differently from the substrate wafer so that, e.g., bond pads on the substrate wafer will be freely accessible after sawing. Therefore, a smaller surface area generally is to be sawn out from the lid wafer than from the substrate wafer. If the materials of the lid and substrate wafers additionally differ significantly in their compositions or their thicknesses, joint sawing may be impossible since one of the substrates will be destroyed in the process. A further disadvantage relates to the cost of the method particularly if the lid wafer is made of a specific material and is therefore expensive. If the substrate wafer exhibits a poor yield (many defective detector chips), the expensive lid wafer will not be used in the best manner possible, since both intact and defective chips have lids bonded onto them.

A further disadvantage relates to the process of soldering, for which, for example, a solder glass or a low-melting eutectic (for example Au/Sn, 80%/20%, 280°) is used. By means of conventionally deposited solders, the distance between the substrate and the lid wafer cannot simply be adjusted in a reproducible manner since the solder is deposited in various thicknesses. In order to ensure at least a minimum distance, a cavity is often etched into the lid wafer above each chip. The depth of this cavity then predefines a minimum distance from the surface of the substrate wafer. However, this process is costly and entails a series of additional process steps, which moreover complicate deposition of the metal and solder frame on the lid chip. Also, use of soft solder highly restricts the temperature of further processing chips packaged in such a manner.

For connecting CMOS chips, a technique has recently been developed wherein individual chips are deposited on a substrate wafer using a high-speed flip-chip bonder. The publication "Advanced-Chip-to-Wafer Technology: Enabling Technology for Volume Production of 3D System Integration on Wafer Level", Christoph Scheiring et al., IMAPS 2004, Long Beach, Nov. 14-18, 2004, describes an application which has been developed to electrically interconnect different CMOS chips. For example, the substrate wafer may be manufactured using CMOS logic chips, the lid wafer consists of memory chips. After applying a soldering frame, the lid wafer is sawn up into pieces, and memory chips tested and found to be "functioning" are bonded, as lids, onto chips of the substrate wafer which were also found to be "functioning" in tests. In addition, no soft solder is employed, but the solid liquid interdiffusion (SLID) technique is used. A layer of low-melting metal, e.g. tin (Sn), is placed between top and bottom layers of higher-melting metal, e.g. copper (Cu), and melted at low temperature. The Sn now diffuses upward and downward into the Cu. A higher-melting compound, e.g. $Cu_3Sn$, is formed in the process, which solidifies and connects the two Cu layers.

When building micro-electromechanical systems (MEMS), the SLID technique is frequently used for connecting individual components of the system. SLID is based on that in a suitably selected system consisting of two metals, wherein one metal has a lower melting point than the other metal, a stable alloy may be formed which has a higher melting point than the lower-melting metal. If such metals are contacted with one another and heated to above the melting temperature of the lower-melting metal, the latter will melt and diffuse into the higher-melting metal, so that at the boundary layer an alloy will form which, if the partners have been suitably selected, again exhibits a higher melting temperature than the lower-melting material. If the geometric boundary conditions are suitably selected, the lower-melting metal will fully melt, and a higher-melting and therefore solid alloy, which fully contains the lower-melting metal, will form at the joint.

U.S. Pat. No. 6,793,829 B2 describes that micromechanical components exhibiting the layer sequence of CR/AU/IN/AU/CR may be interconnected in this manner. In this context, what is shown is that a substrate comprising micromechanical components may be connected, by SLID, to a lid consisting, for example, of silicon, glass or ceramic. US patent application 2004/0266048 A1 describes a similar process.

SUMMARY

According to an embodiment, a method of producing a package including an electrical circuit may have the steps of: providing a first substrate including a plurality of electrical circuits; testing the electrical circuits for their functionality; producing a first frame, which encloses at least one electrical circuit, on a surface of the first substrate; connecting a second substrate having a second frame, which is adapted to the first frame on a surface of the second substrate, to the first substrate so that the first frame and the second frame lie on top of each other, so as to package a functional electrical circuit, the surface of the second substrate being smaller than the surface of the first substrate; and singulating the functional electrical circuit along a singulation contour which does not intersect the surface of the second substrate.

According to another embodiment, a package including an electrical circuit may have: a first substrate including an electrical circuit; a second substrate arranged above a free volume opposite the first substrate; a frame delimiting the free volume between the first and second substrates, said frame having a first metal on both sides of a boundary area arranged between the first and second substrates, the boundary area including an alloy of the first metal and a second metal; a melting temperature of the second metal being lower than a melting temperature of the first metal and a melting temperature of the alloy.

The present invention is based on the findings that a package comprising an electrical circuit may be manufactured in a more efficient manner if, on a substrate comprising a plurality of electrical circuits, the circuits are checked for their functionality, and if the functional circuits are connected, by means of a frame enclosing the circuit on the surface of the substrate, to a second substrate whose surface area is less than that of the first substrate. The substrates are connected, by means of a second frame adapted to the first frame, on the surface of the second substrate such that the first and second frames lie on top of each other. Thereafter, the functional packaged circuits may be singulated in a technologically simple manner.

In one embodiment of the present invention, electrical circuits on a wafer are packaged only if they have been found to be functional in a test. In this context, a frame is initially formed, around the electrical circuit, on the surface of the substrate supporting or integrating the circuit. Subsequently, a lid consisting of a second substrate is provided, said lid also comprising a frame which is arranged as a mirror image in relation to the frame of the first substrate. For producing the package, lids are deposited, for the functional electrical circuits, such that initially the frames of the two substrates are aligned with each other and are then connected to each other. Singulation of the electrical circuits for which packaging has been completed does not take place until after the package has been produced on the wafer, which, among other things, has the advantage that only one wafer material, namely that of the wafer or substrate comprising the electrical circuits, is sawn up by means of a wafer saw.

In addition, the inventive method has the major advantage that the geometrical extension of the lid may be selected at random, i.e., for example, that the lid may be smaller than the device for which processing has been completed. For example, bond pads for contacting the component may remain outside the packaged area so as to enable future contacting of the enclosed component by means of standard methods.

In an advantageous embodiment of the present invention, the two frames are connected by means of an SLID method, wherein copper (Cu) and tin (Sn) are used as the metallic phases and are heated to above the melting temperature of the tin, so that by means of the diffusion of the tin into the copper, an alloy is formed whose the melting point is higher than that of tin so that, after a time period of typically several minutes, a solid metallic connection has evolved which additionally is a good conductor of electrical current.

In this context, the SLID technique has the major advantage that the layer thicknesses of the materials used may be adjusted with an extremely high level of accuracy by means of standard coating methods, so that a distance between the first and second substrates may be adjusted with a high level of precision when the substrates are interconnected by means of the inventive method.

In a further embodiment of the present invention, final connecting of the substrates is performed in a vacuum so that, after connecting the first substrate to the second substrate, a self-contained volume, wherein the gas density is highly reduced, will have been formed between the two substrates.

It is to be noted that it is not possible to create any space which is fully free from matter, and, thus, to create a perfect vacuum. However, technical vacuums may be produced in different qualities. In technology, one differentiates between different qualities of the vacuums achieved by the amount of remaining matter (measured in terms of pressure in Pa=pascal or mbar=millibar):

| Vacuum range | Pressure in hPa | Molecules per cm³ |
| --- | --- | --- |
| Coarse vacuum | 300 . . . 1 | $10^{19} \ldots 10^{16}$ |
| Fine vacuum | 1 . . . $10^{-3}$ | $10^{16} \ldots 10^{13}$ |
| High vacuum (HV) | $10^{-3} \ldots 10^{-7}$ | $10^{13} \ldots 10^{9}$ |
| Ultrahigh vacuum (UHV) | $10^{-7} \ldots 10^{-12}$ | $10^{9} \ldots 10^{4}$ |
| Extra ultrahigh vacuum (EHV) | $<10^{-12}$ | $<10^{4}$ |

For the entire context of this document, the term "vacuum" therefore designates an environment in which the remaining concentration of matter and/or molecules is smaller than $10^{19}/cm^3$.

In a further embodiment of the present invention, the frame is produced such that its first metal, which is located on the side facing the substrate, fully encloses the electrical circuit, whereas the second metal comprising a lower melting point is deposited on the surface of the frame in individual, mutually separated portions, so that a volume which is not filled by the second metal is formed between the portions. This has the major advantage that any gas which may exist within the package to be formed may be more readily drawn off through the gaps which have thus resulted between the frames, if the frames are to be connected in an evacuated environment.

In a further embodiment of the present invention, the second substrate at first is connected to the first substrate by means of a suitable connecting method in a temporary manner. Once all of the substrate lids have been deposited onto the positively-tested electrical circuits of the first substrate, i.e. once the wafer has been fully processed, the wafer is transported, along with the provisionally attached substrate lids, into a heatable process chamber in order to complete processing. This has the major advantage that the connecting process, which is relatively time-consuming and wherein the melting temperature is exceeded for a certain amount of time determined by the diffusion of the low-melting material, may be separated from the alignment process, which significantly increases the process throughput.

In an advantageous embodiment of the present invention, the package is produced, according to the invention, for a substrate or a wafer on whose surface microbolometers were processed. Since it is desired that microbolometers be sensitive to radiation in the infrared range, as has already been described, an extremely thin lid chip, or a lid chip exhibiting excellent optical properties, is used in order to ensure functioning of the bolometer. In addition, when building resistive bolometers, the volume within which the bolometer is located may be evacuated up to a certain degree. The inventive method of connecting two substrates by means of a frame made of metals which may form an alloy with each other is particularly advantageous in two respects.

It shall be noted here that infrared radiation or thermal radiation in physics is a designation for electromagnetic waves within the spectral range between visible light and longer-wave microwave radiation. This corresponds to a wavelength range from about 780 nm to 1 mm. Short-wave IR radiation is often referred to as "near infrared" (NIR), wavelengths of approx. 5 . . . 20 micrometers are often referred to as "mid infrared" (MIR). Extremely long-wave IR radiation is referred to as "far infrared" (FIR). It borders on the range of terahertz radiation. Since there are no clear-cut dividing lines between the spectral ranges, the terms infrared or infrared spectral range shall be taken to be synonymous with a wavelength range from 700 nm to 2 mm in the context of the entire document.

One point to note is that different substrate materials may be connected to one another by means of the method of SLID, so that this is also true, in particular, for the sensitive entry windows for infrared radiation. Another point to note is that the inventive method is particularly suitable since in the connection, a completely metallic connection is created between the upper and lower substrates which per se exhibits a high level of impermeability to gas, so that it is possible, according to the invention, to efficiently and fully encapsulate the sensor as early as at the wafer level. In this context, an almost random gas composition, in particular also a vacuum, may be created within the encapsulated volume.

With the package technique proposed here, individual lid chips are thus bonded onto a substrate wafer using the SLID technique. A frame of Cu/Sn is deposited around each chip on the substrate, and each lid is provided with a matching Cu frame. The lids may additionally be provided with an adhesive layer by means of which they are placed on and provisionally "adhered" to the substrate. In a further step, in a second plant, all of the lids may be simultaneously soldered in the SLID method under vacuum (or under protective gas). Any adhesive layer that may have been deposited evaporates in the process. Subsequently, the chips may be separated and be processed further individually.

In accordance with the invention, a vacuum-tight connection may thus be created between the substrate and the lid, said connection avoiding a number of disadvantages of conventional technology. Such a miniature package may be employed in a particularly advantageous manner for infrared sensors as well as for micromechanical devices.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
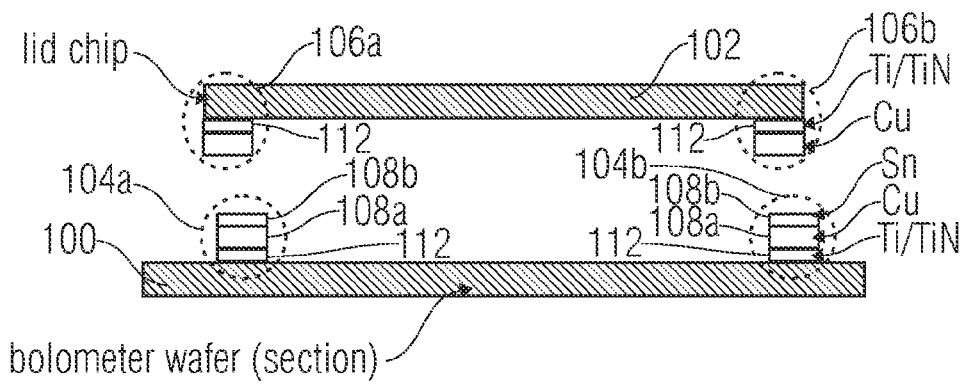
FIG. 1 shows an example of substrates to be connected in accordance with the invention.

FIG. 1 shows an example of substrates for creating a package which have been prepared in accordance with the invention.

FIG. 1 shows a first substrate 100, or a wafer, only a portion of a wafer being shown here, said wafer comprising several of the portions shown in FIG. 1.

In addition, a second substrate, or a lid chip, 102 is depicted.

In the sectional view of the wafer 100 and of the lid chip 102, cross-sections of frames 104a and 104b enclosing an electrical circuit on the wafer 100 are also shown on the wafer 100. The inventive complementary counterparts, frames 106a and 106b of the second substrate or lid chip 102, are also depicted in FIG. 1.

In accordance with the invention, the frame of at least one of the substrates consists of a layer sequence of two metals which together may form an alloy whose the melting point is higher than the melting point of the lower-melting one of the two metals. The frame(s) 104a and/or 104b therefore consists of a first layer 108a made of copper, which has a second layer 108b made of tin deposited onto it. Likewise, the layer of the frame(s) 106a and/or 106b of the lid chip 102, said layer facing the first wafer 100, is made of copper, so that a layer sequence Cu/Sn/Cu results when the two chips are placed one on top of the other in accordance with the invention.

In accordance with the invention, the two chips may now be interconnected by means of SLID (solid liquid interdiffusion), since Cu and Sn may form a metastable phase $Cu_6Sn_5$ having a melting temperature of 415° C., and a stable phase of $Cu_3Sn$ having a melting temperature of 678° C. Since tin itself has a melting temperature of about 251° C., a metallic connection will be created between the wafer 100 and the lid chip 102 when the substrates, which have been placed one on top of the other, are heated over a relatively long time, for example at a temperature of about 300° C. Depending on the duration of the heating process, the metastable or the stable phase is formed. To avoid additional undesired diffusion of wafer materials into the copper layer, or to actually enable adherence of a copper layer onto the surface of the wafers, additional metallic layers may be arranged between the copper layer 108 of the frame and the wafers, as may be seen in FIG. 1. One example of such layers is the layer 112, shown in FIG. 1, which is initially arranged on the wafer surfaces as an adhesive layer of pure titanium, whereupon a layer of TiN is arranged as a diffusion barrier between the titanium layer and the copper layer.

In the inventive process, individual lid chips 102 are thus bonded onto the chips of the still undivided substrate wafer 100. Advantageously, the SLID method is employed as the interconnection technique. The starting substrate used is advantageously a silicon wafer which has an electrical circuit such as a bolometer array fabricated thereon and is also referred to as a substrate wafer.

Another example of an electrical circuit of a processable wafer is, e.g., an arrangement of a multitude of micro-mirrors or other micromechanical elements.

Prior to exposing the bolometer membranes in the manufacturing process by removing a sacrificial layer, which is typically used, a ring of adhesive metal (for example Ti, 50 nm), a barrier (for example TiN, TiW, 120 nm), a layer of a high-melting metal (e.g. Cu, Ag, Au, 5 μm) and of low-melting metal (for example Sn, In 3 μm) is placed around each chip on the wafer. This may be performed by means of conventional sequential electrodeposition of the layers on a wafer provided with a photoresist (for example 8 μm) if in the area of the metal rings, the resist was exposed to light and removed by being developed.

Deposition by means of conventional methods, which may also comprise sputtering and other layer-by-layer deposition methods for example, exhibits the major advantage that the layer thicknesses and, thus, the distance between the wafer 100 and the lid chip 102 may be adjusted and/or reproduced with a high level of accuracy.

For the further considerations, a layer sequence of Ti/TiN/Cu/Sn as can be seen in FIG. 1 will mainly be used, the lid wafer also being provided with a layer sequence of Ti/TiN/Cu. The specific choice of material is certainly not compulsory for successful application of the inventive method, as other material components, by means of which SLID methods are possible, are also suited to implement the inventive concept. If, as is shown by means of FIG. 1, tin (Sn) is used as the melting metal, a tin layer at the lid chip 102 may also be dispensed with if the tin layer has already been applied to the wafer 100. Alternatively, however, it is also possible to coat both frames with tin, of course. In addition, the tin layer cannot only be directly electrodeposited onto the copper ring, which has also been electrodeposited. It is also possible to apply a further photo technique to the wafer after the copper deposition, said photo technique limiting the surface area for further deposition of the tin, as may be seen in FIG. 2, for example.

Figure 2:
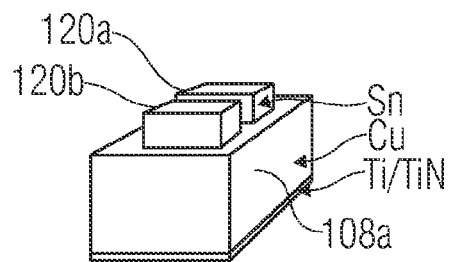
FIG. 2 shows an example of the layered structure of an inventive frame.

As an example, FIG. 2 shows that a tin layer has been deposited in a block-wise manner in blocks 120a and 120b on the copper layer 108a of the frame, said blocks not fully covering the copper layer 108a. In this manner, it is prevented that, during melting of the tin, molten tin escapes on the sides and possibly creates a short-circuit with potential neighboring Cu bumps during soldering. A further substantial advantage of such an arrangement is that the channels formed on the surface of the copper ring 108a by the tin blocks 120a and 120b enable reliable evacuation of any vacuum enclosed by the ring, when the lid chip 102 has already been placed on the wafer 100. During actual soldering, the channels fill up with the molten tin, so that the entire system is eventually leak-tight. A structuring as can be seen in FIG. 2, or any other type of fine structuring, may also be created in the soft tin, for example by means of a stamp.

Figure 3:
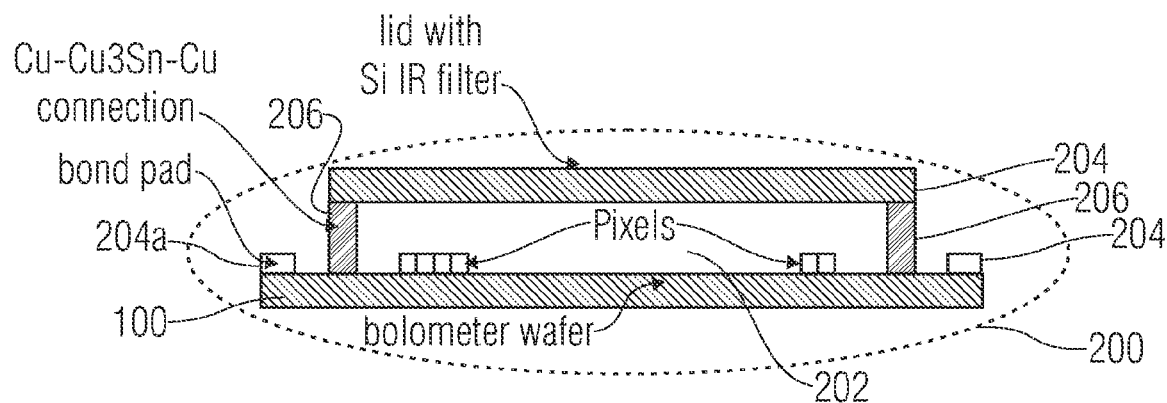
FIG. 3 shows an example of a device on which processing has been completed.

So as to proceed from the situation shown in FIG. 1 to a package for which processing has been completed, as can be seen in FIG. 3, a number of steps are performed which shall be briefly illustrated below. Initially, the lid chip 102 is to be provided, for which purpose said lid chip 102 is typically sawn off a wafer on which the frames have already been processed.

Then the lid may be provisionally attached on the substrate wafer, the simplest implementation comprising merely placing the lid 102 onto the wafer 100.

In an advantageous embodiment of the present invention, the bonding head, by means of which the lid chip 102 is held during placement, is heated and is held upside down with the metal frame. Thereafter, an adhesive layer (for example of bibenzyl or ethylene glycol, EG 2000) is applied. In this context, the bonding head is heated to 60° C., for example, so that the adhesive-layer material having a melting point of about 55° C. remains liquid at the heated lid chip. Of course, other adhesive materials having possibly even higher melting temperatures are also possible as long as the melting temperature of the adhesive material is lower than the melting temperature of the lower-melting metal.

The moveable bonding head is adjusted relative to the substrate wafer such that the frames of the lid and of the chip on the substrate wafer directly face each other.

By lowering the bonding head, the lid chip 102 is pressed onto the substrate 100. If any adhesive-layer material was previously applied, this will cool down and solidify when the substrate 100 is clearly colder than the melting temperature of the adhesive-layer material or the bonding head.

If no specific adhesive-layer material is used, a temporary connection between the frame of the lid chip 102 and the frame of the wafer 100 may be created, for example by friction welding, when the bonding head exhibits a temperature of more than 100° C. and if the lid chip 102 is moved in relation to the wafer 100 while being placed. This may additionally be supported by an ultrasonic source.

In accordance with the invention, this process of adjusting and/or connecting the lid chip 102 to the wafer 100 is repeated for such time until all of the desired chips on the substrate wafer have been provided with a lid.

Then, all of the lids are attached on the wafer 100 at the same time by soldering. To this end, the wafer 100 with the lids is placed into an evacuated brazier, and is initially heated up to a first temperature (for example 50-100° C.). Thereafter, the chamber of the brazier may be evacuated, a purifying rinse of the volume of the brazier using a suitable substance such as formic acid possibly being provided additionally. After the cleaning, renewed evacuation of the brazier may take place.

The actual process of connecting the substrates by means of the frames is performed by heating them to a second temperature (in the example of the Cu—Sn system, to 300° C., for example). If this temperature is maintained for several seconds, the molten tin will diffuse into the copper. A metastable phase, the $Cu_6Sn_5$ phase, will initially form. If the heating process is maintained for more than about 30 minutes, the stable $Cu_3Sn$ phase will form.

During the connecting process, the lid chips 102 may be pressed onto the substrate within the brazier by means of a heatable elastic membrane. Alternatively, the connecting process may also be performed without any pressure, this resulting in the additional advantage that in order to minimize its surface energy, the molten tin centers and automatically adjusts, as it were, the lid chip 102 on the copper frame of the wafer 100, this adjustment being more accurate than that of any conventional bonding apparatus.

It is to be noted that the metastable phase occurs as early as after several 10 seconds so that in one variant of the inventive method, the processed wafer may be tempered under vacuum along with other wafers in another batch brazier during the time of conversion from the $Cu_6Sn_5$ phase to the $Cu_3Sn$ phase so as not to reduce the throughput of the entire process.

In an alternative embodiment, the lid may also be soldered onto the substrate by means of conventional soldering (e.g. Au/Sn solder) rather than using the advantageous SLID technique.

Figure 7:
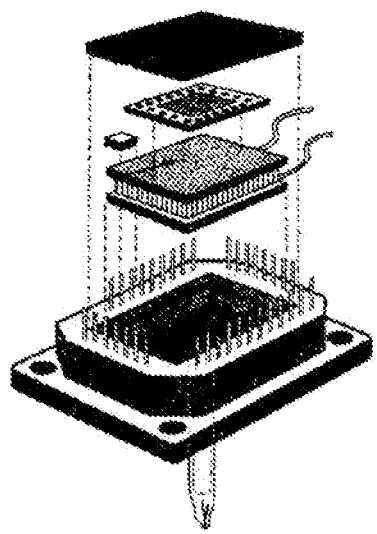
FIG. 7 shows an exploded view of a conventional vacuum package.
Figure 8:
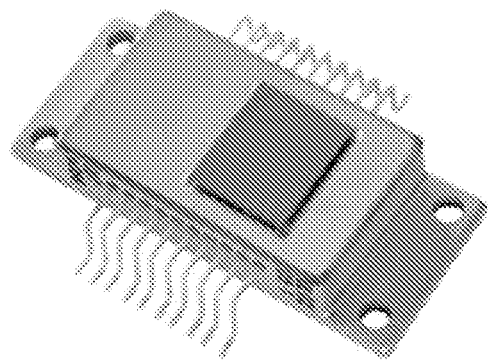
FIG. 8 shows an example of a conventional vacuum package.

After applying the lid chip 102 and after vacuum-soldering the lids, the sensitive IR sensor arrays of the bolometers are protected. Thereafter, the wafer 100 may be sawn up into the individual chips, an example of such a chip being depicted in FIG. 3 or 7. After singulating the chips, the IR arrays may be processed further by means of chip-on-board technique or other assembly processes (for example by mounting a flexible circuit board).

FIG. 3 shows an example of a bolometer chip 200 which has been fabricated in accordance with the invention and has sensitive sensor pixels 202 arranged on its first substrate 100. Bond pads 204a and 204b for electrically contacting the pixels 202 are arranged outside the package. The lid of the package 204 is connected, in accordance with the invention, to the substrate 100 via a frame 206 which was connected by means of SLID and which consequently exhibits the characteristic order of materials of Cu—$Cu_3Sn$—Cu as results while Cu and Sn are connected by means of SLID.

A major advantage of the inventive concept becomes immediately obvious by looking at FIG. 3. On account of the manufacturing process, the lid wafer need not have the same size as the substrate wafer, so that by this very fact, configurations as that in FIG. 3 become possible wherein bond pads are arranged outside the packaged area, so that these areas are freely accessible after singulation.

Moreover, unlike conventional methods, no cavities are necessary within the lid chip 102 since the high-melting material (copper) is not softened during manufacturing and since, as a result, the distance between the substrate and the lid at least corresponds to the sum of the thicknesses of the two copper layers.

In the case of the system comprising copper and tin, an advantageous soldering temperature is about 300° C. The resulting connection is highly heat-resistant since the melting point of pure copper is 1085° C., and that of the stable phase $Cu_3Sn$ is 678° C. What is remarkable is that even the metastable phase $Cu_6Sn_5$ already exhibits a melting temperature of 415° C., so that a Cu—$Cu_3Sn$ connection created within several seconds is no longer separable in the event of further tempering at 300° C., so that, for example, the fabricated package may be processed further using normal soldering steps, even if the stable phase has not yet been achieved.

A further advantage of populating the substrate with lid chips 102 in a singulated manner is that individually adhered lids may be evacuated substantially more easily than a lid wafer covering the entire surface of the wafer 100. If, in addition, tin is deposited only locally on a copper ring by electrodeposition or other steps, as is shown in FIG. 2, evacuation of the individual cavities is particularly readily possible.

Figure 4A:
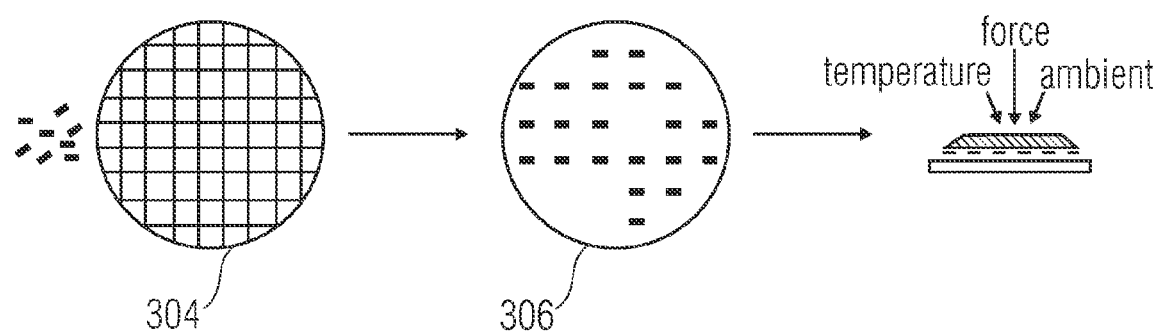
FIG. 4a show illustrations of the increase in the process and 4b effectiveness which can be achieved in accordance with the invention.
Figure 4B:
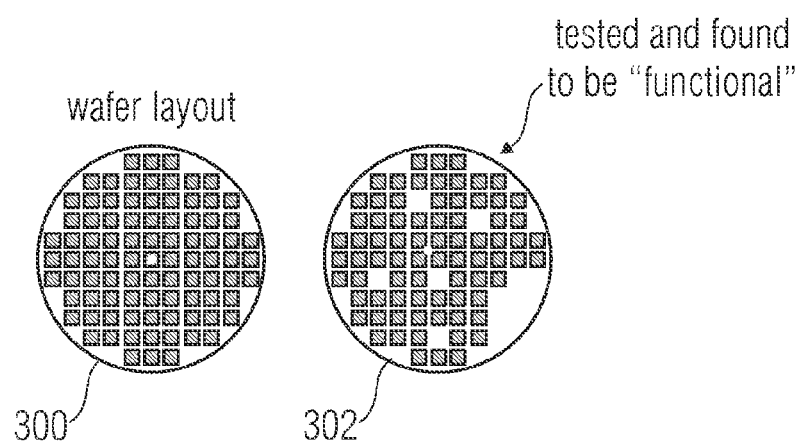

A further major advantage of the inventive method is that only those chips of the substrate wafer 100 which have been found to be "functioning" during testing need to be provided with a lid, as is depicted by FIGS. 4a and 4b.

FIG. 4b initially depicts a processed wafer 300 comprising processed chips or electrical circuits or micromechanical components at regular intervals.

Only those electrical circuits which were deemed to be functional by a quality test are depicted in the selected wafer 302. As may readily be acknowledged, it is advantageous, with regard to the cost entailed, to provide only those electrical circuits with a lid chip or a second substrate which are functional, so that, all in all, the scenario shown in FIG. 4a results, wherein only those areas are populated with lids, starting from a wafer 304, which have passed the functionality test. Preliminary bonding results in a wafer assembly 306, the processing of which is subsequently completed by means of soldering, which may be performed, for example, by additionally exerting a force onto the lid chips.

Individually populating is particularly interesting and cost-saving when the lid chip itself contains a circuit and is comparatively expensive as a result. Additionally, only flawless lid chips are selected for bonding, of course, so that the overall yield of defect-free chips is potentially clearly higher than in wafer-to-wafer bonding, wherein connecting a wafer 100, the processing of which has been completed, to a lid wafer, the processing of which has been completed, is performed in a single step, a resulting component being useless already when only one of the combined components of the wafer or of the lid wafer is non-functional.

A further advantage of the applicability of the inventive method which is not to be underestimated is that a large choice of materials in terms of (high-melting and low-melting) metals is available for applying the SLID method. In this context it is to be noted that adjusting and placing the individual lid chips onto the wafer may be effected, by means of current high-speed bonders, at a speed which performs up to 10,000 such operations (bonds) per hour, so that no throughput problem is created by aligning the lids individually. This particularly applies if the individual lid chips are attached, in accordance with the invention, in an initially preliminary manner, so that the actual connecting process by means of SLID may be performed independently of the bonding.

A further major advantage is that, after the bonding of the lids, the sensors and/or the electrical or micromechanical circuits within the package are already protected. In this context, however, any adjustment structures which may be present remain visible on the wafer surface (substrate wafer surface), so that an automatic wafer saw comprising picture recognition may be employed for separating the chips, which considerably simplifies the singulating process.

As has already been mentioned several times, complex structures, sensors or CMOS circuits may also be bonded onto the substrate wafer instead of simple lids, which once again highlights the high level of flexibility of the inventive method.

By means of the packaged circuits shown in FIGS. 1 and 3, the inventive method for producing these circuits shall be once again described below in detail. After this, the general inventive concept shall be illustrated once again by means of a flowchart.

For fabricating the lid chips 102, first of all sputtering of an adhesive layer and of a diffusion barrier (Ti and TiN) onto the surface of the lid substrate is performed. Thereafter, an electrodeposition seed layer consisting of copper is deposited by sputtering. Then, the structure of the solder ring or of the frame is created by means of photo technique, a resist thickness of 8 µm being used, for example. The first copper layer of the frame may now be deposited at a thickness of, e.g., 5 µm by means of a subsequent copper electrodeposition. Thereafter, the tin layer is produced on the copper layer of the frame, said tin layer either being sputtered directly or being produced by means of an additional photolithographic procedure, wherein deposition on the copper layer may possibly be performed only in a spatially discrete manner. An advantageous layer thickness of the tin ranges from 1 to 3 µm. After removing the photoresist, the seed layer and/or the adhesive layer and the diffusion barrier may be wet-etched. The inventive singulation of the lid chips may then be performed by clamping the lid wafer onto a sawing film and by singulating the lids using a wafer saw.

The substrate wafer is initially prepared in a manner analogous to the lid wafer, i.e. an adhesive layer and a diffusion barrier of Ti and TiN are initially sputtered onto the surface. The sputtering of the copper electrodeposition seed layer is followed by photolithographic selection of the solder ring, a resist thickness of 5 µm being used, for example. After exposing the frame or ring area to light, a copper frame of a height of 5 µm may be produced by means of copper electrodeposition. After removing the photoresist, the seed layer, or the adhesive layer, and the diffusion barrier may be removed by wet-etching. Once the frame has been fully produced in this manner, in a sensor protected by a sacrificial layer said frame may be etched free by removing the sacrificial layer.

It shall be assumed below that the lid chip is preliminarily attached on the wafer initially by means of an adhesive.

For this purpose, the lid chip is initially to be separated from the sawing film and to be attached to a bonding head, which has been heated to a temperature of more than 60° C. Thereafter, an adhesive, which melts at 55° C., is applied (for example bibenzyl or some other wax). Application may be performed, for example, by an ink jet method, the adhesive at the lid chip initially remaining liquid on account of the temperature of the bonding head.

This is followed by adjusting the lid chip relative to the substrate wafer, so that the solder rings are directly opposite one another. Placing the lid chip onto the cold substrate wafer results in that the adhesive (bibenzyl) cools down to below 55° C. and solidifies, so that after letting go of the bonding head, the lid chip will be fixed on the substrate wafer. As has already been described, preliminary fixing may also be performed by pressing, by means of a slight excess temperature (for example 100° C.), slight friction welding using ultrasound, or other temporary bonding methods, in which case the bibenzyl step as was described above may be dispensed with, of course. By means of the above-described method, all of the lids are initially fixed on the chips, or electrical circuits, (possibly only on those that were found to be "functioning" during testing) on the substrate wafers in accordance with the same method.

Once all lid chips have been fixed, the lidded substrate wafer is transferred to an evacuatable brazier, within which the lid chips may optionally be pressed onto the substrate wafer using a heatable elastomer and defined force. Thereafter, rinsing may be performed using formic acid so as to prevent oxidation. After preliminarily heating the brazier to a temperature of more than 60° C., the adhesive evaporates, so that potential contaminants are removed to a very large extent by subsequently pumping out the brazier. This is followed by heating to the solder temperature (about 300° C. for Cu/Sn). Soldering under vacuum entails maintaining the temperature for a predetermined time period (>10 seconds for achieving the metastable $Cu_6Sn_5$ phase; >30 minutes for the stable $Cu_3Sn$ phase). Thereafter, the wafer may be cooled within the vacuum, the package that has just been produced now containing a vacuum which essentially corresponds to the vacuum level as prevailed within the brazier.

After further processing, the substrate may be sawn up while exploiting the above-described advantages so as to obtain the singulated devices. The devices protected by the package may now be processed further using standard methods such as attaching a flex tape, or by means of chip-on-board assembly and wire bonding, without jeopardizing the sensitive elements within the package.

Figure 5:
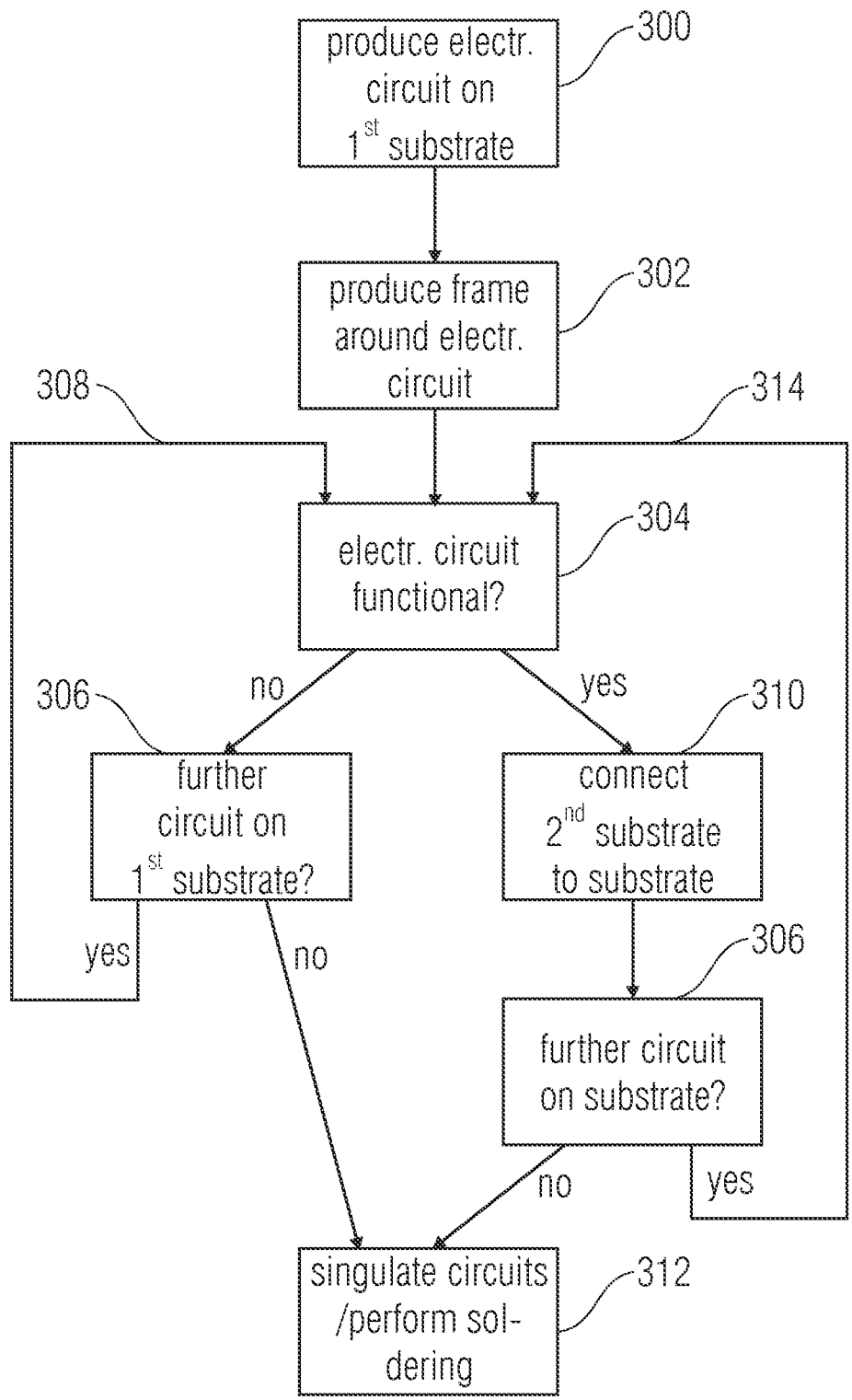
FIG. 5 shows a flowchart for an example of an inventive method.
Figure 6:
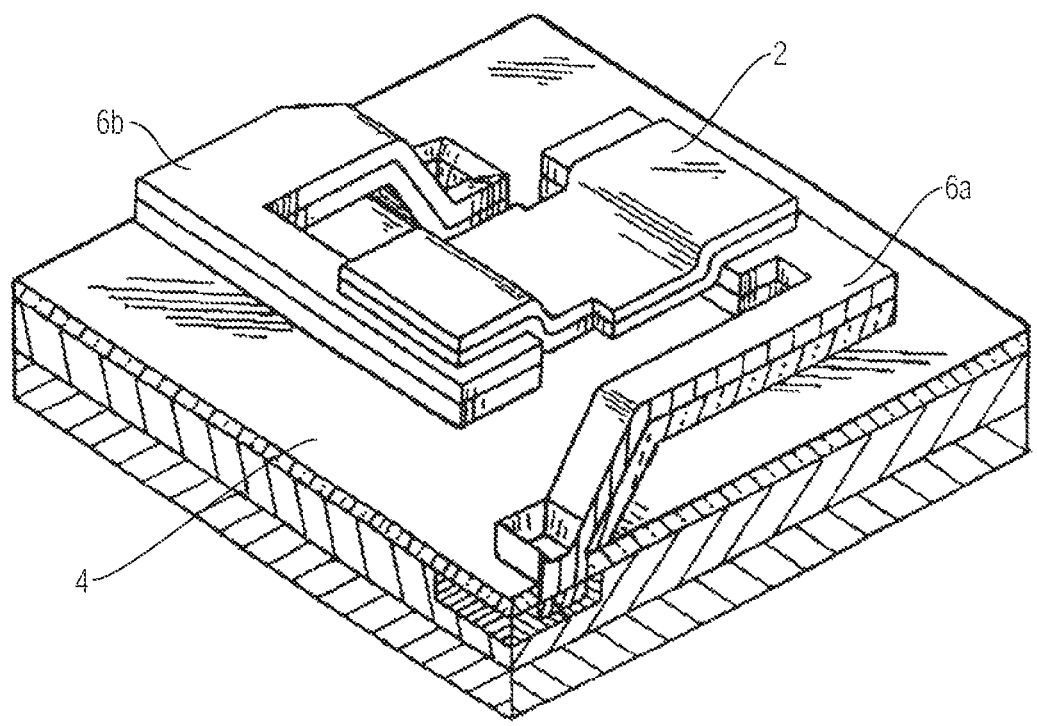
FIG. 6 shows an example of a microbolometer.

Derived from the embodiments which have just been described in detail, the manufacturing method may be summarized using the flowchart shown in FIG. 5.

In the preparation step 300, the substrate comprising the components to be packaged is prepared.

In the step of frame production 302, the frames are produced around the electrical circuits which are arranged on the substrate or integrated within the substrate.

For effectively packaging the electrical and/or micromechanical circuits or components, each of the electrical circuits is tested, in a testing step 304, to see whether it is functional. If this is not the case, a test is performed, in an iteration step 306, to see whether further non-tested circuits exist on the substrate. If this is not the case, the population process will be terminated, and soldering and/or singulating may be continued.

If further circuits exist, one proceeds within the loop 308, and another test is performed to see whether the next electrical circuit is functional.

If the testing step 304 reveals that the electrical circuit is functional, a lid chip is connected, in a connecting step, to the substrate instead of the electrical circuit, whereupon a test is performed, in step 306, to see whether further circuits on the substrate have not yet been tested. If this is not the case, soldering and/or singulating is started in the final step 312. If further circuits exist on the substrate, a second loop 314 is followed, and another test is performed to see whether the next circuit is functional.

Although in the previous paragraphs the application of the inventive concept, and the inventive fabrication of a package was described essentially in terms of packaging a bolometer, the inventive concept is naturally also applicable to any other device to be protected from environmental factors. Examples of this include, among others, pressure sensors, microphones, light sensors and other optical sensor as well as any kind of micromechanical elements such as rotation rate sensors.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method of producing a plurality of packages each comprising an electrical circuit, the method comprising:
   providing a wafer comprising a plurality of electrical circuits;
   testing the plurality of electrical circuits for their functionality so as to obtain an identification of functional electrical circuits and dysfunctional electrical circuits among the plurality of electrical circuits;
   selecting a subset of the plurality of electrical circuits, the subset including at least one of the functional electrical circuits, according to the identification of functional electrical circuits and dysfunctional electrical circuits;
   respectively producing, for the subset of the plurality of electrical circuits, a first frame, which encloses the at least one functional electrical circuit, on a surface of the wafer;
   individually connecting, by use of a flip-chip bonder, and for the subset of the plurality of electrical circuits, a lid comprising a second frame, which is adapted to the first frame, on a surface of the lid, to the wafer so that the first frame and the second frame lie on top of each other so as to package the at least one functional electrical circuit, wherein the step of individually connecting is not performed on, and leaves unpackaged, any electrical circuit of the plurality of electrical circuits not included in the subset of the plurality of electrical circuits; and
   singulating the plurality of electrical circuits by separating the wafer along singulation lines which do not intersect any of circumferences of the lids so as to yield a plurality of packages comprising the functional electrical circuits; wherein
   the step of respectively producing the first frame includes:
   producing a first frame portion from a first metal; and
   producing a second frame portion from a second metal on the first frame portion, the first and second metals selected such that a first melting temperature of an alloy formed from the first and second metals is higher than a second melting temperature of the second metal.

2. The method as claimed in claim 1, wherein the plurality of electrical circuits comprise bolometers.

3. The method as claimed in claim 1, wherein individually connecting comprises interconnecting, for the subset of electrical circuits, the lid and the wafer in a gas-tight manner.

4. The method as claimed in claim 1, wherein the individually connecting is performed in a vacuum or in a protective-gas atmosphere.

5. The method as claimed in claim 1,
   wherein the individually connecting comprises connecting, for the subset of electrical circuits, the second frame such that a side of the second frame facing the wafer comprises the first metal.

6. The method as claimed in claim 5, wherein the first metal is copper and the second metal is tin.

7. The method as claimed in claim 5, wherein the first melting temperature is higher than 400° C., and wherein the second melting temperature is lower than 350° C.

8. The method as claimed in claim 1, wherein the respectively producing the first frame portion comprises producing a diffusion layer from a metallic material.

9. The method as claimed in claim 8, wherein the diffusion layer comprises a combination of one or several layers of the following materials:
   Ti, TiN, TiW.

10. The method as claimed in claim 1, wherein the respectively producing the first frame comprises depositing an electrical solder melting at a predetermined temperature on a side of the frame which faces away from the surface of the lid.

11. The method as claimed claim 1, wherein the individually connecting comprises:
   heating the wafer and the lids for a first time period so as to create a preliminary connection;
   following the first time span, transporting the preliminarily connected wafer and lids to a heatable process chamber; and
   heating the wafer and the lids for a second time span within the heatable process chamber so as to create a final connection.

12. The method as claimed in claim 1, wherein in the step of providing the wafer, the plurality of electrical circuits are integrated within the wafer.

13. The method as claimed in claim 1, wherein the lids are at least partly transmissive to wavelengths in the infrared spectral range.

14. The method as claimed in claim 1, wherein the lid comprises an integrated circuit.

15. The method as claimed in claim 1, wherein the step of individually connecting the lid to the wafer is performed by means of a solid liquid interdiffusion method, wherein the connecting additionally comprises:
   coating at least one of the first frame and the second frame with an adhesive; and
   preliminarily connecting the first and second frames by means of the adhesive so as to achieve relative mutual fixing of the wafer and the lids, wherein the adhesive is selected such that same evaporates during the solid liquid interdiffusion method.

16. The method as claimed in claim 15, wherein the adhesive is bibenzyl, ethylene glycol or wax.

17. The method according to claim 1, the further comprising:
 providing a further wafer;
 producing, for the subset of the plurality of electrical circuits, the second frame on the further wafer; and
 dicing the further wafer so as to singulate the second frames and obtain the lids.

18. The method according to claim 17, wherein the producing, for the subset of the plurality of electrical circuits, the second frame on the further wafer comprises depositing material of the second frame onto the further wafer.

* * * * *